(12) United States Patent
Kuit et al.

(10) Patent No.: US 9,134,631 B2
(45) Date of Patent: Sep. 15, 2015

(54) LITHOGRAPHIC APPARATUS AND DEVICE MANUFACTURING METHOD

(75) Inventors: Jan-Jaap Kuit, Veldhoven (NL); Frank Staals, Eindhoven (NL); Alexander Hendrikus Martinus Van Der Hoff, Valkenswaard (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1342 days.

(21) Appl. No.: 12/407,360

(22) Filed: Mar. 19, 2009

(65) Prior Publication Data
US 2009/0257034 A1    Oct. 15, 2009

Related U.S. Application Data

(60) Provisional application No. 61/064,687, filed on Mar. 20, 2008.

(51) Int. Cl.
*G03B 27/42* (2006.01)
*G03F 7/20* (2006.01)

(52) U.S. Cl.
CPC ........ *G03F 7/70891* (2013.01); *G03F 7/70533* (2013.01)

(58) Field of Classification Search
CPC ....... G03F 7/20; G03F 7/004; G03F 7/70058; G03F 7/0002; G03F 7/0046; G03F 7/2041; G03F 7/70008; G03F 7/70033; G03F 7/70191; G03F 7/70258; G03F 7/704

USPC .......................................................... 355/53
See application file for complete search history.

(56) References Cited

U.S. PATENT DOCUMENTS

2006/0008716 A1*    1/2006   Jeunink et al. .................. 430/30

FOREIGN PATENT DOCUMENTS

| JP | 63-291417 | 11/1988 |
|----|-----------|---------|
| JP | 01-286417 | 11/1989 |
| JP | 09-082599 | 3/1997 |
| JP | 09-298143 | 11/1997 |
| JP | 09-326350 | 12/1997 |
| JP | 2001-230170 | 8/2001 |

OTHER PUBLICATIONS

Japanese Office Action mailed Jul. 13, 2011 in corresponding Japanese Patent Application No. 2009-060345.

* cited by examiner

*Primary Examiner* — Mesfin T Asfaw
(74) *Attorney, Agent, or Firm* — Pillsbury Winthrop Shaw Pittman LLP

(57) ABSTRACT

In a lithographic apparatus, a control system is provided to automatically reduce throughput in the event that lens-heating aberrations exceed a certain threshold. The determination of whether lens-heating aberrations will exceed the threshold may be based upon a prediction, e.g. using a lens-heating model, or on measurements taken from a previously exposed substrate. Reduction of throughput of the device manufacture may be effected by reducing beam power or the duty cycle of the apparatus. In a particular embodiment, the time taken for substrate movement between exposure portions is increased.

20 Claims, 2 Drawing Sheets

LITHOGRAPHIC APPARATUS AND DEVICE MANUFACTURING METHOD

This application claims priority and benefit under 35 U.S.C. §119(e) to U.S. Provisional Patent Application No. 61/064,687, entitled "Lithographic Apparatus and Device Manufacturing Method", filed on Mar. 20, 2008. The content of that application is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging using a projection system onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction During operation of a lithographic apparatus, the elements of the projection system inevitably absorb a certain amount of energy from the beam and therefore heat up. This phenomena is known as "lens-heating" although it also applies to mirrors in reflective and catadioptric projection systems also. The term "lens-heating" will be used below but should not be taken as limiting the invention to use of refractive optical elements only or limited to heating of lenses only. As the elements of the projection system heat up, their shape and/or position may change, introducing aberrations and other errors into the projected image. This is of course undesirable and therefore a variety of efforts have been made to reduce or compensate for the effects of lens-heating. These efforts include cooling lenses, heating lenses with additional heaters to reduce thermal gradients, and introducing adjustable elements into the projection system to compensate for the lens heating effects.

SUMMARY

Existing techniques to deal with the problem of lens heating do not always completely address the problem and some residual aberrations may still exist. It is desirable, for example, to provide an additional technique for the reduction and/or amelioration of lens heating effects.

According to an aspect of the invention, there is provided a lithographic apparatus, comprising:

a projection system arranged to project a pattern from a patterning device onto a substrate; and a control system arranged to automatically reduce throughput of the apparatus in the event that aberrations and/or other errors in the projected image due to heating of elements of the projection system during exposure exceed a certain threshold.

According to an aspect of the invention, there is provided a method of manufacturing a device, comprising:

repeatedly projecting an image of a pattern onto a substrate using a projection system;

determining aberrations and/or other errors in the projected pattern as a result of heating of elements of the projection system; and automatically reducing the rate of device manufacture in the event that the determined aberrations and/or other errors exceed a certain threshold.

According to an aspect of the invention, there is provided a computer program product comprising a computer-readable recording medium having stored thereon code means for controlling a lithographic apparatus having a projection system to perform a method of manufacturing devices, the comprising:

repeatedly projecting an image of a pattern onto a substrate using the projection system;

determining aberrations and/or other errors in the projected pattern as a result of heating of elements of the projection system; and automatically reducing the rate of device manufacture in the event that the determined aberrations and/or other errors exceed a predetermined threshold.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
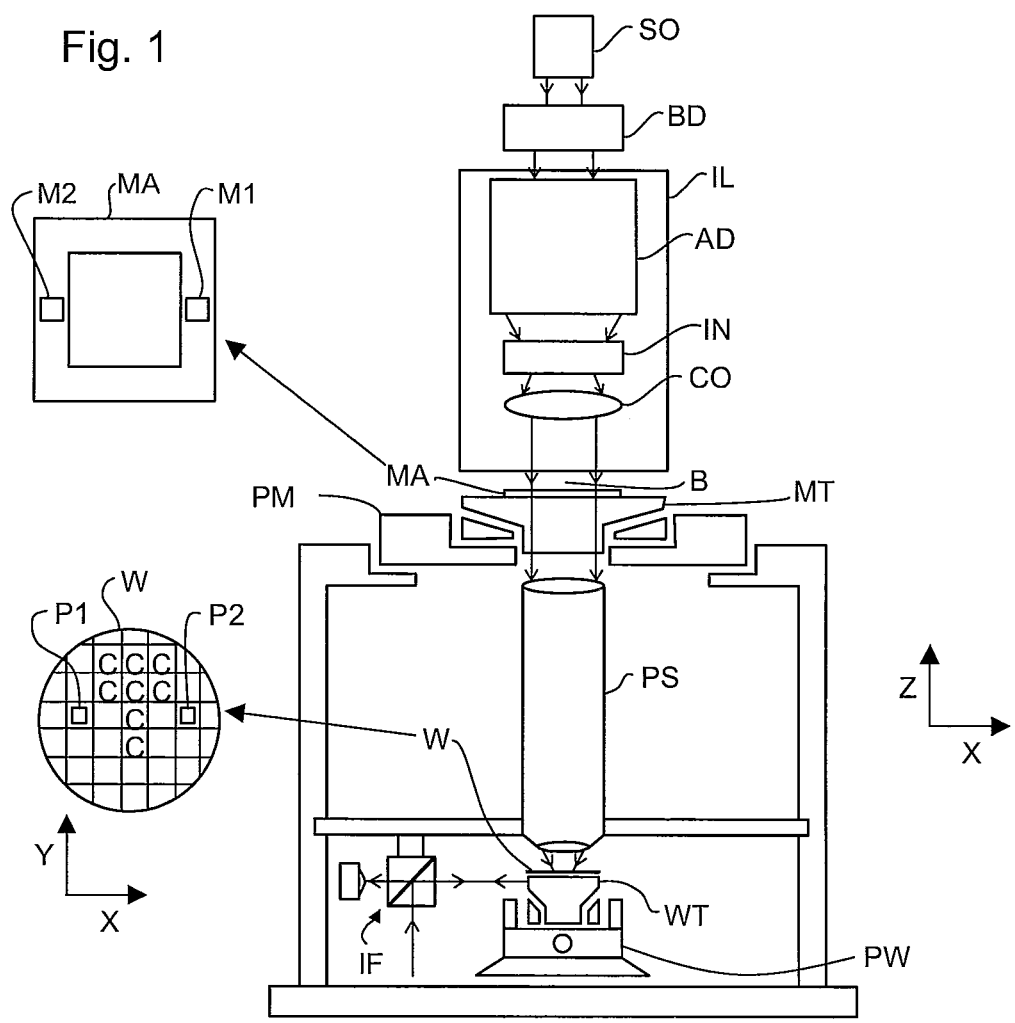
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. Immersion techniques are known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

When the lithographic apparatus is in operation, a small, but non-negligible, part of the energy of the beam B is absorbed by the elements of the projection system. The amount of energy absorbed depends on the type of beam and the elements of the projection system. The proportion of energy absorbed can be quite high, for example with refractive lens elements and ultraviolet radiation of less than 200 nm or multilayer mirrors and EUV radiation. The energy absorbed causes the elements of the projection system to heat up and therefore expand. This expansion can cause changes in their shape, especially when the absorption of radiation is not uniform. Changes in the position and/or spacing of elements are possible. Such changes may introduce aberrations and/or other errors into the projected image and are therefore undesirable. The "other errors in the projected image" may, for example, refer to a deviation from a desired shape of a pattern feature, the feature being part of the printed pattern. An error may be a CD error, e.g. a deviation from a desired critical dimension of a pattern feature. The pattern feature may be present, for example, as a latent image in resist, or as a space in a developed resist layer, or as a feature of undissolved resist on a substrate. Such an error of a size or a shape of printed features can be predicted using a simulation model of the lithographic patterning process including a resist model, or be measured, as explained below.

A variety of approaches to addressing this problem, which is commonly referred to as "lens-heating" even when the elements of the projection system are not lenses, have been proposed or used. In the first instance, these include cooling arrangements that seek to maintain the elements of the projection system at a constant, uniform temperature. Other approaches to solving this problem include the use of adjustable elements in the projection system to compensate for aberrations caused by lens-heating and additional heating devices or steps to reduce temperature gradients in the elements of the projection system. However, these techniques, even when used in combination, do not always totally eliminate aberrations caused by lens-heating; there is often a residual error. Addition of other corrective elements in the projection system to reduce residuals is difficult and expensive.

In the production of devices when the residual lens-heating errors exceed allowable limits, the lithographer may program into the "recipe" for a batch of substrates one or more additional steps, such as an alignment step, to be carried out between substrates or between dies within a substrate to allow additional time for the elements of the projection system to cool down. This practice may be carried out on the basis of trial and error and usually only when a problem has been discovered in a batch of substrates. This is therefore a very inefficient approach to correcting for residual lens-heating errors.

An embodiment of the present invention therefore seeks to provide an automated method and apparatus for dealing with residual lens-heating errors, so as to enable the errors to be kept within acceptable limits as far as possible. Accordingly, an embodiment of the present invention provides an improved control system for the lithographic apparatus, as shown in FIG. 2.

Figure 2:
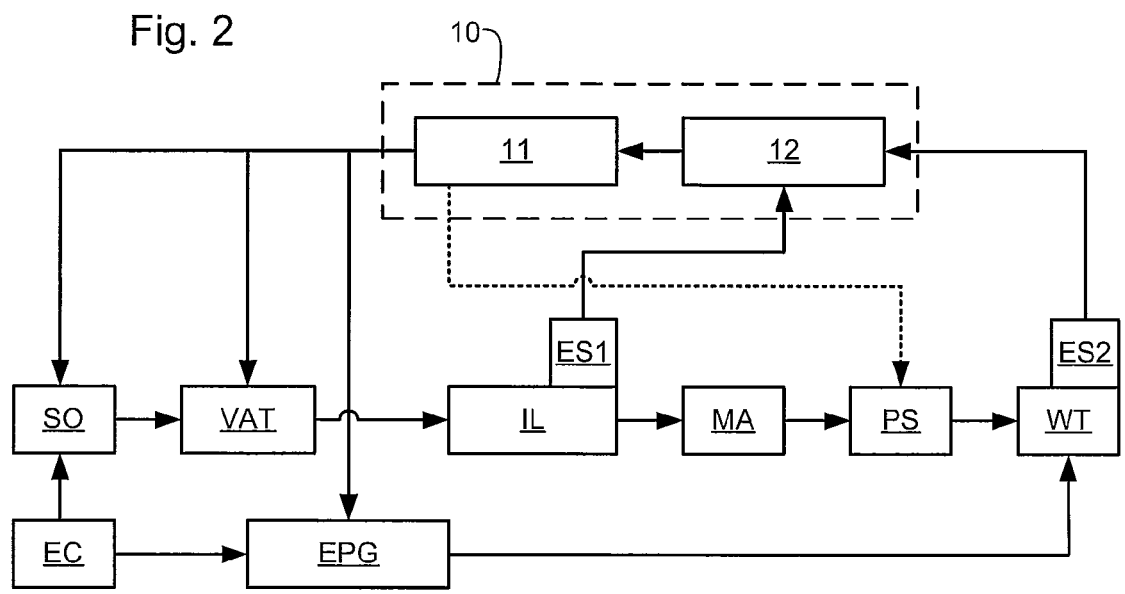
FIG. 2 is a diagram of a control system of an embodiment of the invention.

In FIG. 2, the relevant functional components of the lithographic apparatus are shown in the central line. The source SO delivers radiation to the illuminator IL via a variable attenuator VAT which can control the intensity of the beam. Included in the illuminator is a first energy sensor ES1 which, for example, receives a fixed portion of the beam energy via a partially silvered mirror. The beam B traverses the patterning device MA and projection system PS to the substrate W held on substrate table WT. A second energy sensor ES2 is provided on the substrate table to enable measurements of the beam energy at substrate level. However, since the second energy sensor ES2 is provided adjacent the substrate W, it is used for calibration, not during production exposures. The two energy sensors ES1, ES2, provide inputs to the lens-heating control system 10 of an embodiment of the invention. Image and aberration sensors may be used to provide information on the beam B, in particular actual measurements of lens-heating induced aberrations. Input to the control system 10 is information indicating the illumination mode selected for use in the device exposures and information of the pattern embodied in or provided by patterning device MA. This information may be provided automatically to the control system 10 or may be input by the user of the apparatus via a suitable input device. Information of the pattern may include information such as the size and layout of the pattern, the density of the pattern, the pitches and feature sizes of the device pattern, the type of patterning device (e.g., binary, phase shift), the resist type, the sequence of exposures to be carried out, and any other information useful to predict the heating that will occur in the projection system and the effect that heating will have on the developed image.

The lens-heating control system 10 comprises a lens-heating model 12 and controller 11. The lens-heating model 12 is a software model of the effect of lens-heating on the projected image. It takes as inputs, the information relating to the exposures to be carried out and status information of the apparatus, such as beam intensity, e.g. derived from the energy sensors ES1, ES2. Based on these inputs, the lens-heating model 12 calculates the aberrations and/or other errors that are to be expected in the projected image as a result of lens-heating. Such models may be based upon empirical data or simulations of the exposure process. Based on the predictions of the lens-heating model 12, the controller 11 calculates appropriate corrections to be applied to correct or at least ameliorate these errors. These corrections may include corrections to be applied via one or more adjustable optical elements in the projection system to compensate directly for the predicted aberrations and/or corrections applied by one or more heating and/or cooling elements of the projection system to reduce thermal gradients.

According to an embodiment of the invention, if it is determined by the controller that the corrections that can be applied by other means, such as an adjustable element in the projection system, will not be sufficient to reduce the aberrations caused by lens-heating to within an acceptable limit, the controller applies further corrections that will have the effect of reducing throughput of the lithographic apparatus. By reducing throughput of the lithographic apparatus, the amount of heating of the elements of the projection system will be reduced with the aim that the errors will likewise be reduced and can then be corrected, or brought within an acceptable limit, by one or more available manipulators in the projection system.

The additional controls that can be applied by the controller 11 to reduce throughput of the apparatus, may include reducing the optical power set point of the source SO, adjusting the attenuation applied by the variable attenuator VAT, and/or controlling the exposure profile generator EPG to reduce the duty cycle of the apparatus. The duty cycle of the apparatus is the ratio of the time spent actually performing exposures to the total elapsed time. Reducing the duty cycle has the effect that the elements of the projection system can be cooled down more between actual exposures. Reducing the duty cycle of the apparatus may be a desirable option for reducing lens-heating because it enables the beam settings, such as beam power and scan speed, set by exposure control unit EC for the actual exposures to be left undisturbed. These settings may be optimized for an exposure to ensure an appropriate exposure in a relatively narrow process window so that altering them may cause additional complications.

Figure 3:
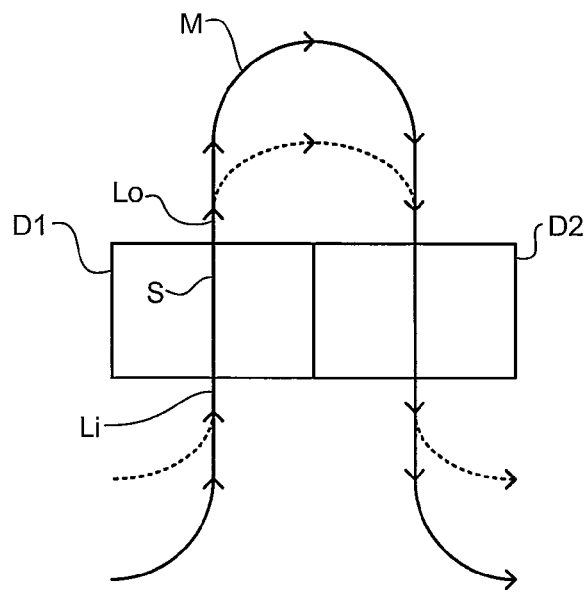
FIG. 3 is a diagram showing the trajectory of a beam relative to target portions of a substrate.

The duty cycle of the apparatus can be reduced in various ways, which are explained with reference to FIG. 3 which shows the path of the center of the beam B relative to two target portions D1 and D2 on the substrate. Note that for convenience the Figure shows the beam moving relative to the target portions but in practice in most apparatus the beam is stationary and the substrate moved underneath it. As can be seen in FIG. 3, the path of the beam includes: a lead-in portion Li, during which the substrate is lined up and brought to the correct speed; the scan portion S during which the actual scanning exposure is carried out; a lead-out portion Lo during which the correctness of the scan trajectory can be confirmed; and a meander portion M during which the substrate is decelerated, shifted in the X direction and reaccelerated for the exposure of the next target portion D2. Normally, the throughput of the apparatus will be maximized by using a trajectory, shown in dotted lines in FIG. 3, for which the lead-in, lead-out and meander portions of the beam trajectory are minimized.

According to an embodiment of the invention, the throughput can be reduced by altering the parameters of one or more of the lead-in, lead-out and meander portions, without affecting the scan portion S. For example, the lead-in and lead-out portions can simply be extended. Additionally or alternatively, the decelerations and accelerations in the meander portion can be reduced or the beam trajectory simply taken on an extended path, as shown by the solid line in FIG. 3 if the scan range of the object table allows. Any suitable combination of such changes can be applied, as required to achieve the necessary reduction in duty cycle to allow the lens-heating effects to be reduced to a point where they can be fully corrected, or residuals reduced to an acceptable level, by one or more available manipulators in the projection system. In an embodiment of the invention, it may be desirable to slow down the meander path of the trajectory without allowing the apparatus to come to a complete stop, to avoid drift, as this can be effected with minimum alterations to the existing control system of the apparatus. In other cases, introducing a delay between steps may be desirable. Adjustments to the trajectory that may improve the exposure in other ways, e.g. by reducing vibrations or allowing additional time for settling or measurements, may be desirable.

In addition to or alternatively from reducing the duty cycle, it is possible to reduce the beam strength and correspondingly the scan speed so that the same effective dose is delivered at substrate level. However, such a change may need to be combined with one or more other controls, depending on resist type.

While a feed forward correction has been described above based upon predicted lens-heating effects, it is possible when exposing multiple substrates of a batch to include a throughput reduction based upon measured errors in send-ahead substrates or the early substrates of a batch. Also, an embodiment of the invention has been described in terms of scanning modes of operation but is also applicable in a stepping apparatus or mode of operation. In such a mode or apparatus, it is simple to introduce a delay into the stepping operation between flash exposures. It will further be appreciated that an embodiment of the present invention may be incorporated in a newly designed and constructed apparatus or may be effected by way of a programming update to an existing apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
   a projection system arranged to project a pattern image from a patterning device onto a substrate;
   a correction apparatus configured to make a correction to an aberration and/or other error in the projected image due to heating of an element of the projection system during exposure; and
   a control system configured to:
      determine whether the correction apparatus has not been able to make, or will not be able to make, the correction sufficient to reduce the aberration and/or other error to within a certain threshold; and
      in the event that the correction is not, or will not be, sufficient to reduce the aberration and/or other error to within the certain threshold, automatically cause reduction in throughput of the apparatus by taking an action other than, or in addition to, adding a measurement.

2. The apparatus of claim 1, wherein the control system comprises a model arranged to predict the aberration and/or other error due to heating of the element of the projection system, based on a parameter of the exposure.

3. The apparatus of claim 2, wherein the parameter of the exposure includes at least one parameter selected from: illumination mode, beam intensity or power, a parameter of the pattern to be imaged, transmissivity of the patterning device, and/or history of exposures performed by the apparatus.

4. The apparatus of claim 1, further comprising an input module configured to receive a measurement of an error in a previously exposed substrate and wherein the control system is configured to be responsive to the measurement of the error in the previously exposed substrate to determine the reduction in throughput.

5. The apparatus of claim 1, wherein the control system is configured to reduce throughput by reducing a duty cycle of the apparatus.

6. The apparatus of claim 5, wherein the control system is configured to reduce throughput of the apparatus by increasing time spent with a beam not traversing the projection system between exposures.

7. The apparatus of claim 5, further comprising a positioner configured to effect a relative movement between the substrate and the projection system, and wherein the controller is configured to control the positioner to increase an amount of time taken for movement of the substrate relative to the projection system between exposures.

8. The apparatus of claim 7, wherein the positioner is configured to effect a meandering movement, each cycle of the meandering movement comprising a scan portion during which exposure of a target portion of the substrate is performed, lead-in and lead-out portions preceding and succeeding respectively the scan portion, and a meander portion during which the substrate is positioned for exposure of a subsequent target portion, and the control system is configured to reduce throughput of the apparatus by increasing a (i) lead-in portion, or (ii) lead-out portion, or (iii) meander portion, or (iv) any combination selected from (i)-(iii), of the substrate path.

9. The apparatus of claim 1, wherein the control system is configured to reduce throughput of the apparatus by reducing an intensity of the projected image at the substrate.

10. A method of manufacturing a device, the method comprising:
    repeatedly projecting an image of a pattern onto a substrate using a projection system of an apparatus;
    determining an aberration and/or other error in the projected pattern as a result of heating of an element of the projection system, wherein the apparatus comprises a correction apparatus configured to make a correction to aberrations and/or other errors in the projected pattern due to heating of the element of the projection system during exposure;
    determining whether the correction apparatus has not been able to make, or will not be able to make, the correction sufficient to reduce the aberration and/or other error to within a certain threshold; and
    in the event that the correction is not, or will not be, sufficient to reduce the aberration and/or other error to within the certain threshold, automatically reducing the rate of device manufacture by taking an action other than, or in addition to, adding a measurement.

11. The method of claim 10, wherein determining the aberration and/or other error in the projected pattern is performed using a model arranged to predict the aberration and/or other error as a result of heating of the element of the projection system, based on a parameter of the exposure.

12. The method of claim 11, wherein the parameter of the exposure includes at least one parameter selected from: illumination mode, beam intensity or power, a parameter of the pattern to be imaged, transmissivity of a patterning device used to form the pattern, and/or history of exposures performed by projection system.

13. The method of claim 10, wherein determining the aberration and/or other error in the projected pattern is performed using a measurement of an error in a previously exposed substrate.

14. The method of claim 10, wherein reducing the rate of device manufacture comprises reducing throughput by reducing the duty cycle of the step of repeatedly projecting.

15. The method of claim 14, wherein reducing throughput comprises increasing time spent with a beam not traversing the projection system between exposures.

16. The method of claim 15, further comprising effecting a relative movement between the substrate and the projection system, and wherein increasing time spent with the beam not traversing the projection system comprises increasing an amount of time taken for movement of the substrate relative to the projection system between exposures.

17. The method of claim 16, wherein the relative movement is a meandering movement, each cycle of the meandering movement comprising a scan portion during which exposure of a target portion of the substrate is performed, lead-in and lead-out portions preceding and succeeding respectively the scan portion, and a meander portion during which the substrate is positioned for exposure of a subsequent target portion, and increasing the amount of time taken for movement of the substrate relative to the projection system between exposures comprises increasing a (i) lead-in portion, or (ii) lead-out portion, or (iii) meander portion, or (iv) any combination selected from (i)-(iii), of the substrate path.

18. The method of claim 10, wherein reducing the rate of device manufacture comprises reducing intensity of the projected pattern at the substrate.

19. The apparatus of claim 9, wherein the control system is configured to reduce intensity by controlling at least one parameter selected from: beam power, beam duty cycle, energy per beam pulse, beam pulse repetition rate, and/or attenuation applied by a variable attenuator.

20. A computer program product comprising a non-transitory computer-readable recording medium having stored thereon code configured to control a lithographic apparatus to perform a method of manufacturing a device, the method comprising:

repeatedly projecting an image of a pattern onto a substrate using a projection system of the lithographic apparatus;

determining an aberration and/or other error in the projected pattern as a result of heating of an element of the projection system, wherein the apparatus comprises a correction apparatus configured to make a correction to aberrations and/or other errors in the projected pattern due to heating of the element of the projection system during exposure;

determining whether the correction apparatus has not been able, to make, or will not be able to make, the correction sufficient to reduce the aberration and/or other error to within a certain threshold; and in the event that the correction is not, or will not be, sufficient to reduce the aberration and/or other error to within the certain threshold, automatically reducing the rate of device manufacture by taking an action other than, or in addition to, adding a measurement.

\* \* \* \* \*